US012800807B2

(12) United States Patent
Triggs-Ramm et al.

(10) Patent No.: US 12,800,807 B2
(45) Date of Patent: Nov. 17, 2026

(54) DISPLAY DEVICE AND PROJECTION DEVICE

(71) Applicant: E INK CORPORATION, Billerica, MA (US)

(72) Inventors: Graham Triggs-Ramm, Aberdeenshire (GB); Peiman Hosseini, London (GB)

(73) Assignee: E Ink Corporation, Billerica, MA (US)

( * ) Notice: Subject to any disclaimer, the term of this patent is extended or adjusted under 35 U.S.C. 154(b) by 201 days.

(21) Appl. No.: 18/290,761

(22) PCT Filed: Oct. 6, 2022

(86) PCT No.: PCT/GB2022/052526

§ 371 (c)(1),
(2) Date: Jan. 20, 2024

(87) PCT Pub. No.: WO2023/057760

PCT Pub. Date: Apr. 13, 2023

(65) Prior Publication Data

US 2024/0369746 A1 Nov. 7, 2024

(30) Foreign Application Priority Data

Oct. 6, 2021 (GB) ..................................... 2114302

(51) Int. Cl.
*G02B 5/18* (2006.01)
*H04N 9/31* (2006.01)
(Continued)

(52) U.S. Cl.
CPC ......... *G02B 5/1814* (2013.01); *G02B 5/1842* (2013.01); *H04N 9/3152* (2013.01); *H10N 70/231* (2023.02); *H10N 70/8828* (2023.02)

(58) Field of Classification Search
None
See application file for complete search history.

(56) References Cited

U.S. PATENT DOCUMENTS 9,081,150 B2 * 7/2015 Magnusson .............. G02B 5/18
9,323,044 B2 4/2016 Feenstra et al.
(Continued)

FOREIGN PATENT DOCUMENTS

CN 212586668 U 2/2021
EP 3608369 A1 2/2020
(Continued)

OTHER PUBLICATIONS

Castillo, Garcia S. et al., "57-4: Solid State Reflective Display (SRD®) with LTPS Diode Backplane", SID Digest, vol. 50, No. 1, pp. 807-810 (2019).

(Continued)

*Primary Examiner* — Jyotsna V Dabbi
(74) *Attorney, Agent, or Firm* — Min G. Song; Brian D. Bean

(57) ABSTRACT

Display devices and methods for displaying a pattern are provided. A display device includes at least one display element having a layered structure. The layered structure includes a diffraction layer having a periodic structure configured to diffract incident visible light into a guided-mode resonance in the layered structure. The layered structure further includes a first phase change material layer and a second phase change material layer positioned on opposite sides of the diffraction layer. Each phase change material layer includes phase change material thermally switchable between two stable states having different refractive indices. The phase change material is positioned to allow coupling between the guided-mode resonance and the phase change material.

23 Claims, 8 Drawing Sheets

(51) Int. Cl.

| | |
|---|---|
| ***H10N 70/00*** | (2023.01) |
| ***H10N 70/20*** | (2023.01) |

(56) References Cited

U.S. PATENT DOCUMENTS

| | | | | |
|---|---|---|---|---|
| 9,733,402 | B2 | 8/2017 | Liu et al. | |
| 9,823,538 | B2 * | 11/2017 | Bhaskaran | G02F 1/0105 |
| 9,987,873 | B2 | 6/2018 | Petiton et al. | |
| 10,068,606 | B2 | 9/2018 | Bhaskaran et al. | |
| 10,317,707 | B2 | 6/2019 | Hosseini et al. | |
| 10,634,938 | B2 * | 4/2020 | Fang | C23C 14/0623 |
| 10,718,987 | B2 | 7/2020 | Hosseini et al. | |
| 10,884,267 | B2 | 1/2021 | Bhaskaran et al. | |
| 10,884,314 | B2 | 1/2021 | Broughton et al. | |
| 11,215,852 | B2 | 1/2022 | Hosseini et al. | |
| 11,392,088 | B2 | 7/2022 | Rottenberg et al. | |
| 11,467,466 | B2 | 10/2022 | Paolini, Jr. et al. | |
| 11,506,917 | B2 | 11/2022 | Rottenberg et al. | |
| 11,520,172 | B2 | 12/2022 | Bhaskaran et al. | |
| 11,708,958 | B2 | 7/2023 | Hertel et al. | |
| 2015/0253470 | A1 * | 9/2015 | Liu | G02B 5/1828 359/290 |
| 2016/0334647 | A1 | 11/2016 | Lin et al. | |
| 2019/0064555 | A1 * | 2/2019 | Hosseini | G02F 1/0147 |
| 2020/0124881 | A1 | 4/2020 | Hosseini | |
| 2020/0202804 | A1 | 6/2020 | Garcia et al. | |
| 2020/0209059 | A1 | 7/2020 | Sarwat et al. | |
| 2023/0288773 | A1 * | 9/2023 | Abdollahramezani | G02B 1/005 |

FOREIGN PATENT DOCUMENTS

| | | | |
|---|---|---|---|
| JP | 2007095274 | A | 4/2007 |
| WO | 2009033601 | A1 | 3/2009 |
| WO | 2012076171 | A1 | 6/2012 |
| WO | 2015097469 | A2 | 7/2015 |

OTHER PUBLICATIONS

Broughton, Ben et al., "38-4: Solid State Reflective Display (SRD®) Utilizing Ultrathin Phase-Change Materials", SID Digest, vol. 48, No. 1, pp. 546-549 (2017).

European Patent Office, "International Search Report and Written Opinion", PCT/GB2022/052526, Jan. 2, 2023.

Karvounis, A. et al., "All-dielectric phase-change reconfigurable metasurface", Applied Physics Letters, vol. 109, p. 051103-1-5, (2016).

Liu, Longju et al., "A phase-change thin film-tuned photonic crystal device", Nanotechnology, vol. 30, No. 045203, pp. 1-8 (2019).

* cited by examiner

DISPLAY DEVICE AND PROJECTION DEVICE

The present invention relates to display devices using phase change material (PCM) and guided-mode resonance.

PCM based reflective display devices in which an optical switching effect is thermally modulated are disclosed in WO2017134506A1 and related publications 'Garcia Castillo, S. et al., "57-4: Solid State Reflective Display (SRD®) with LTPS Diode Backplane", SID Digest, 50, 1, pp 807-810 (2019)' and 'Broughton, B. et al., "38-4: Solid-State Reflective Displays (SRD®) Utilizing Ultrathin Phase-Change Materials", SID Digest, 48, 1, pp 546-549 (2017)'.

A colour display can be provided by combining a layered structure with PCM and a shutter arrangement. The PCM can be switched between white and a colour, while the shutter arrangement can be switched between transparent and opaque. Combining the PCM and the shutter optically in series provides control of both colour and brightness. It would be desirable, however, to improve the optical performance of known displays based on PCM, to simplify their structure, and/or to provide different optical effects.

It is an object of the invention to improve the optical performance of, simplify the structure of, or provide different effects with, displays based on PCM.

According to an aspect, there is provided a display device for displaying a pattern, comprising: at least one display element having a layered structure, the layered structure comprising: a diffraction layer comprising a periodic structure configured to diffract incident visible light into a guided-mode resonance in the layered structure; and a phase change material layer comprising phase change material that is thermally switchable between two stable states having different refractive indices, the phase change material being positioned to allow coupling between the guided-mode resonance and the phase change material.

Thus a display device is provided in which PCM in display elements is positioned so as to interact optically with guided-mode resonances. The confinement of incident radiation associated with resonance greatly strengthens the influence of the PCM, such that switching of the PCM provides a radical change in the optical properties, typically reflectance, of the display element concerned. The combination of PCM and guided-mode resonance provides degrees of freedom that allow a wide range of optical effects to be achieved, thereby providing enhanced flexibility for tuning optical properties of the device and/or the ability to produce attractive and/or distinctive visual effects that are difficult or impossible to achieve by other means.

In some arrangements, the two stable states of the PCM comprise a high extinction coefficient state and a low extinction coefficient state with a ratio of a mean average over the visible spectrum of the extinction coefficient of the phase change material layer in the high extinction coefficient state to a mean average over the visible spectrum of the extinction coefficient of the phase change material layer in the low extinction coefficient state being greater than 3.0. In some arrangements, a mean average over the visible spectrum of the extinction coefficient in the high extinction coefficient state is less than 1.0. The extinction coefficient in the low extinction coefficient state is therefore very low. Having a very low extinction coefficient means the PCM is highly transparent in that stable state, without the PCM layer needing to be undesirably thin. When the PCM is in this stable state, the PCM has minimum effect on guided-modes, despite the enhanced interaction between the radiation and the PCM caused by the resonance condition. The appearance of the display element when the PCM is in the low extinction coefficient state will be dominated by the filter properties determined by the guided-mode resonance and not by the PCM. In contrast, when the PCM is switched to the high extinction coefficient state the absorption in the PCM will greatly suppress the guided-mode resonance. The PCM may therefore act as a shutter in this state, effectively "switching off" the display element into a dark state.

The invention will now be further described, by way of example, with reference to the accompanying drawings, in which.

Figure 1:
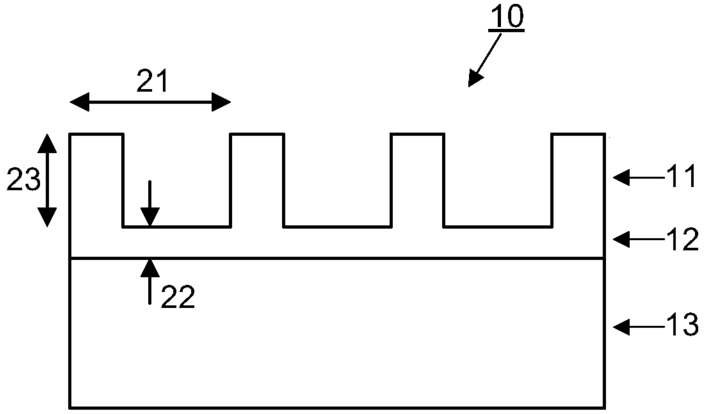
FIG. 1 is a schematic side sectional view of a diffraction grating without phase change material.

FIG. 1 depicts a layered structure 10 comprising a diffraction layer 11 that is configured to provide guided-mode resonance. The diffraction layer 11 comprises a periodic structure. The periodic structure defines alternating regions of different refractive index in the form of a diffraction grating. Lines of the diffraction grating extend perpendicularly into and out of the page in the orientation shown. The diffraction layer 11 is provided on a support layer 12. The support layer 12 and a portion of the periodic structure are formed from $TiO_2$ in this example. The regions of diffractive index consist of alternating regions of $TiO_2$ (having a refractive index of 2.5) and air in the example shown. A period 21 of the periodic structure is indicated by the double-headed arrow labelled 21. The support layer 12 is provided on a glass substrate layer 13.

Figure 2:
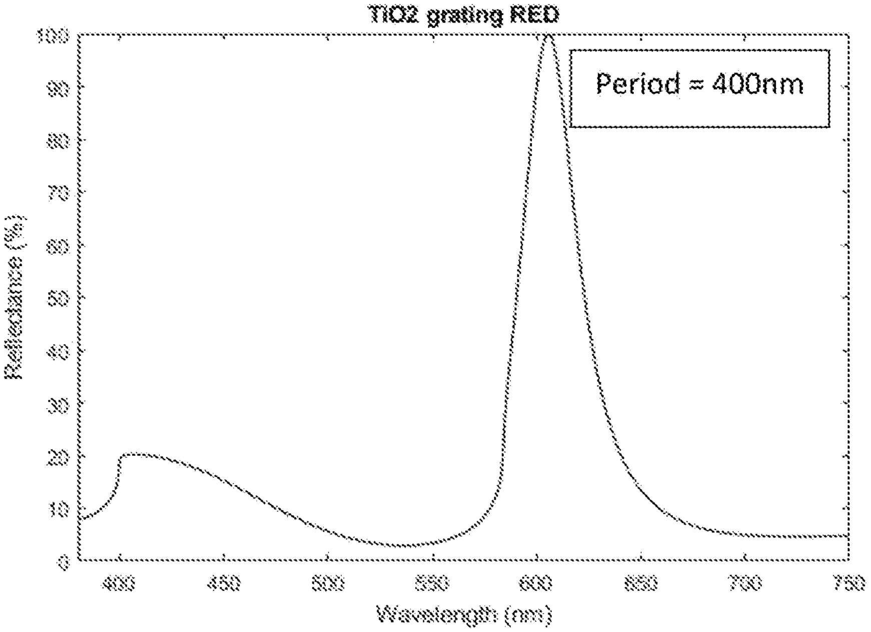
FIGS. 2-4 depict example reflectance spectra from the grating of FIG. 1 for grating periods of 400 nm, 345 nm and 315 nm respectively.
Figure 3:
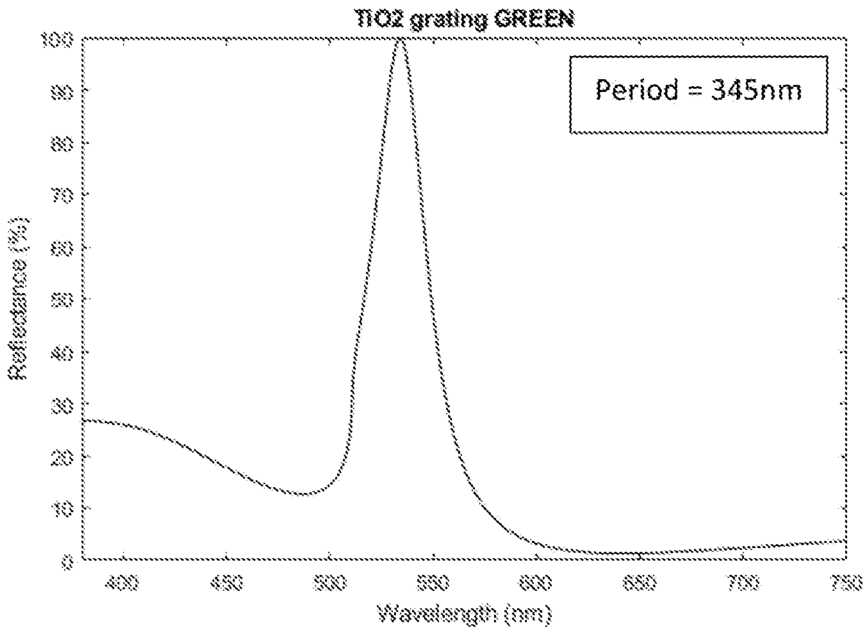
Figure 4:
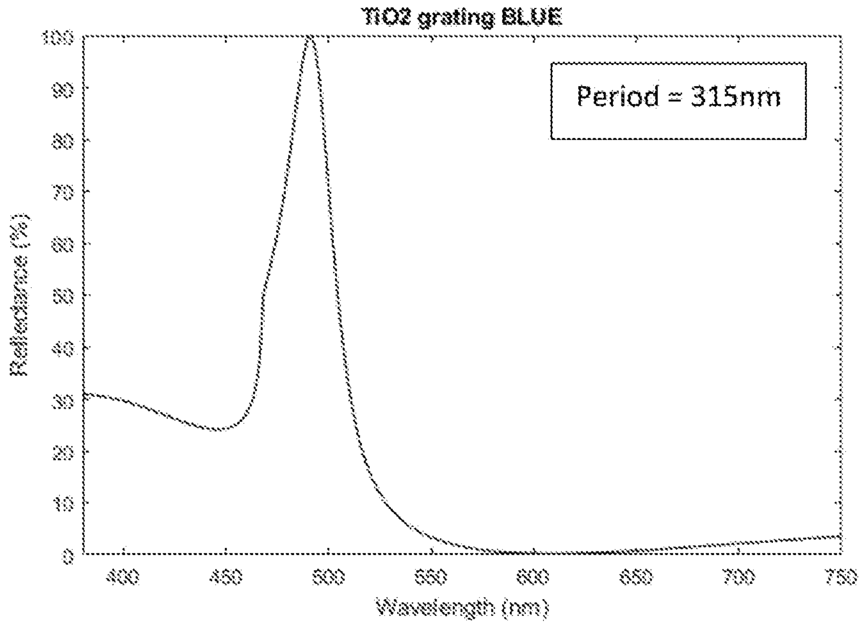

For certain frequencies of incident light (from above), the light is diffracted by the periodic structure into a resonant mode of a waveguiding element. In the example shown, the waveguiding element includes the support layer 12 but other elements of the layered structure may also contribute to the waveguiding effect. The guided-mode resonance makes the layered structure 10 highly reflective for frequencies at or near resonance. The layered structure 10 can be substantially transparent for other frequencies. The guided-mode resonance thus allows the layered structure 10 to selectively reflect light as a function of wavelength depending on the periodicity of the periodic structure. Such an arrangement can be configured to reflect very pure colours. Three example spectra are depicted respectively in FIGS. 2-4 for the configuration depicted in FIG. 1, with the thickness 22 of the support layer 12 being 20 nm and the thickness 23 of the diffraction layer 11 being 140 nm (such that the total thickness of $TiO_2$ is 160 nm). FIG. 2 shows reflectance of red coloured light from white incident light (achieved with the periodic structure having a period 21 of 400 nm). FIG. 3 shows reflectance of green coloured light from white incident light (achieved with the periodic structure having a period 21 of 345 nm). FIG. 4 shows reflectance of blue coloured light from white incident light (achieved with the periodic structure having a period 21 of 315 nm).

The reflection properties of the layered structure 10 are highly sensitive to the angle of incidence of light onto the layered structure 10 and on the polarization state of the light (except for two-dimensional gratings under certain conditions). The curves shown are for normal incidence and TE polarization (with the electric field component perpendicular to the plane of incidence and thus parallel to the lines of the grating-pointing out of the page).

Embodiments of the present disclosure relate to display devices and methods for displaying a pattern. The devices and methods use guided-mode resonance of the type described above in combination with phase change materials (PCMs) to provide a range of reflectance effects.

Figure 5:
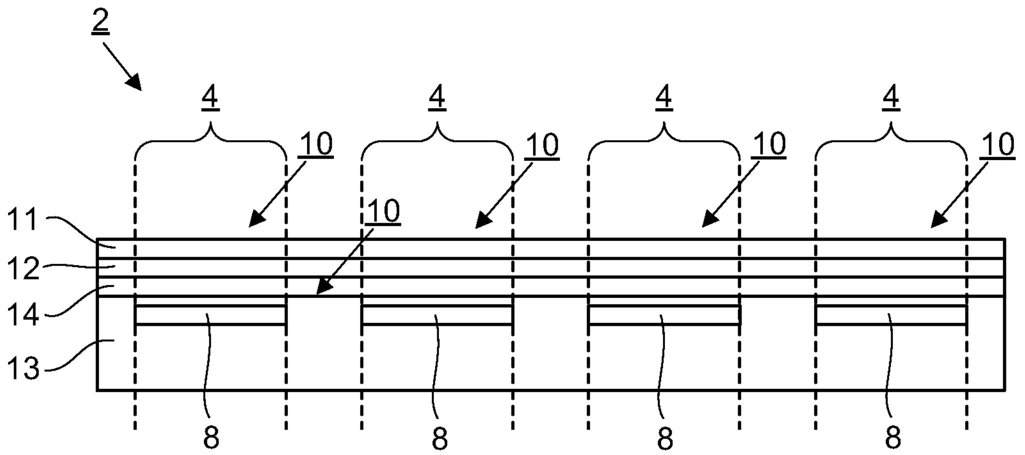
FIG. 5 is a schematic side sectional view of a portion of a display device comprising plural display elements.
Figure 6:
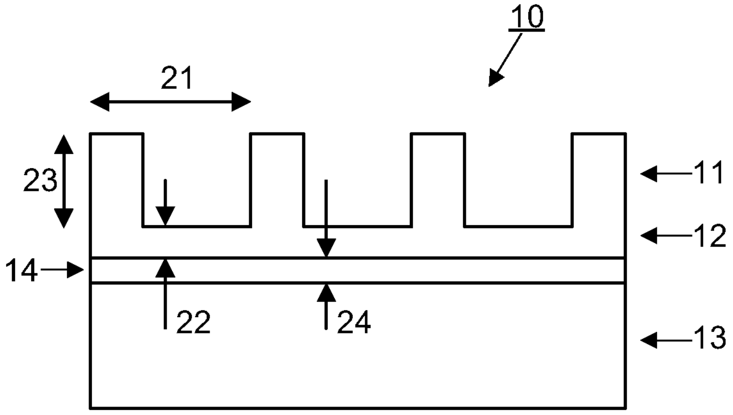
FIG. 6 is a schematic side sectional view of a portion of a layered structure having a diffraction layer and a PCM layer.

FIG. 5 is a schematic side sectional view of a portion of an example display device 2. The device 2 is configured to display a pattern via a plurality of display elements 4. In other embodiments, a single display element 4 is provided and may be patterned by selectively switching a region or regions within the display element 4 (e.g. using a laser). A portion of an example display element 4 for use in either scenario is depicted in FIG. 6.

Each display element 4 (and/or one or more regions within each display element 4) may be individually switchable between states having different reflective properties to define the pattern. The pattern may be a visible pattern (e.g. visible unaided by the human eye or via a microscope) or may be a machine-readable pattern (e.g. containing elements that are too small for the human eye or which need to be viewed using wavelengths of light that are not visible to the human eye). The pattern may define a picture, text or other visual information. In the embodiment shown, the device 2 is configured to operate as an active display with the pattern displayed being controlled by heating elements 8. In other embodiments, the display elements 4 may be switched externally (e.g. using a laser) and/or at a point of manufacture (e.g. to provide a static optical effect, for use for example as a difficult-to-reproduce security marking).

Each display element 4 comprises a layered structure 10. The layered structure 10 comprises a plurality of layers, one on top of the other. The layered structure may comprise a thin film stack. The layered structure 10 comprises a diffraction layer 11. The diffraction layer comprises a periodic structure. The diffraction layer 11 may take any of the forms described above with reference to FIG. 1 or other forms. The periodic structure may thus be configured to diffract visible light incident on the display device 2 into a guided-mode resonance within the layered structure 10. The periodic structure comprises regions of different refractive index. As in the example of FIG. 1, the periodic structure may comprise alternating regions of different refractive index in the form of a diffraction grating. The alternating regions may alternate between a solid material (e.g. $TiO_2$) and a gas (e.g. air) or between two different solid materials (having different refractive index relative to each other). Typically, large differences in refractive index will lead to resonances that are more sharply defined in frequency. Smaller differences in refractive index will lead to broader resonances.

In some embodiments, the diffraction layer 11 is provided on a first support layer 12. In some embodiments, the first support layer 12 has the same composition as a portion of the periodic structure (e.g., $TiO_2$). The first support layer 12 may be integrally connected with the portion of the periodic structure having the same composition (i.e. without any interfaces). In other embodiments, the first support layer 12 is formed from a material different from all of the materials making up the periodic structure.

Figure 7:
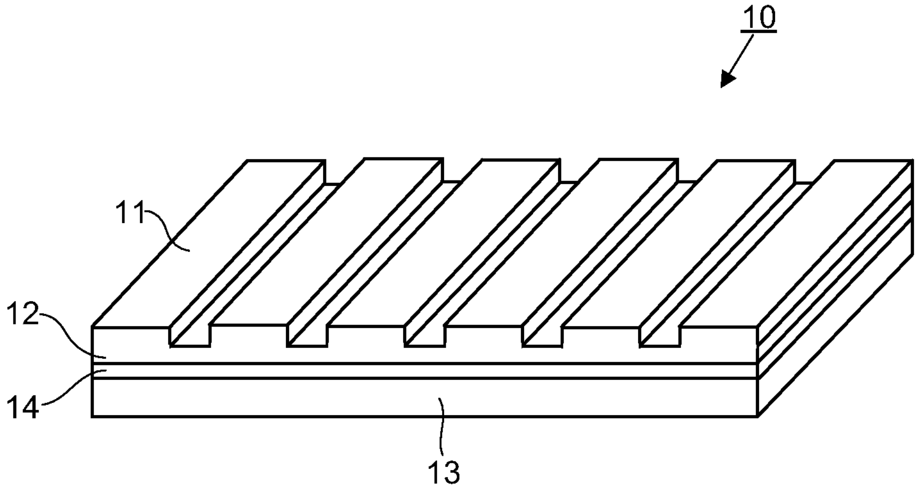
FIG. 7 is a schematic perspective view of a portion of a layered structure in which the diffraction layer is periodic in one direction.
Figure 8:
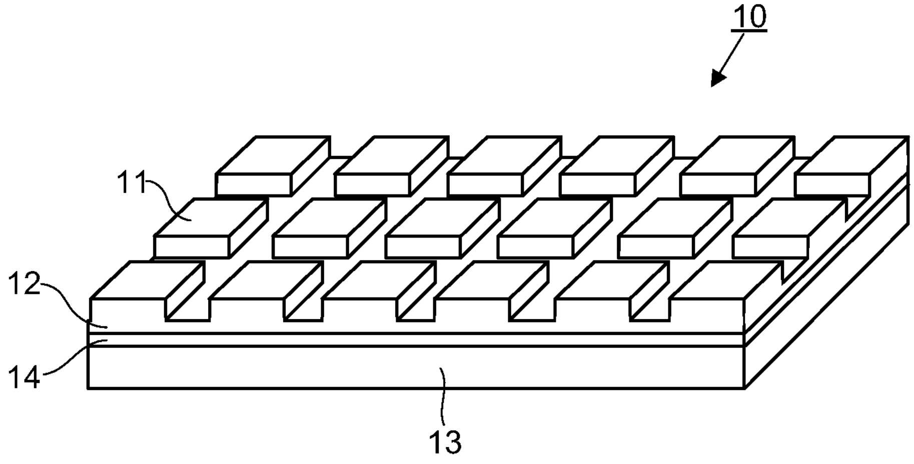
FIG. 8 is a schematic perspective view of a portion of a layered structure in which the diffraction layer is periodic in two directions.

The periodic structure may take various forms. In one class of embodiment, the periodic structure may be periodic in one dimension only, as exemplified schematically in FIG. 7. The periodic structure may thus define a 1-dimensional line grating (with lines of the diffraction grating extending into and out of the page in the orientation shown in FIG. 6). In other embodiments, the periodic structure may be periodic in two directions, as exemplified in FIG. 8. In some embodiments, the periodic structure defines crossed gratings. In some embodiments, the periodic structure is configured to be periodic in two directions in such a manner as to make the reflectance properties of the display element polarization independent. This may facilitate high visual quality in certain display applications. Alternatively, the periodic structure may be deliberately configured to provide complex polarization effects, which may be desirable in applications such as security markings where an aim is to make characteristics of the display difficult to reproduce, and/or in applications where complex visual effects are sought for other reasons (e.g. for decorative reasons). In some embodiments, the periodic structure has a pattern with a first periodicity in at least one direction and a second periodicity in at least one direction, the first periodicity being different to the second periodicity, thereby achieving still further difficult-to-reproduce and/or decorative visual effects. In some embodiments, the periodic structure further comprises a blazed grating or a metastructure, which may be used to achieve still further visual effects.

Figure 12:
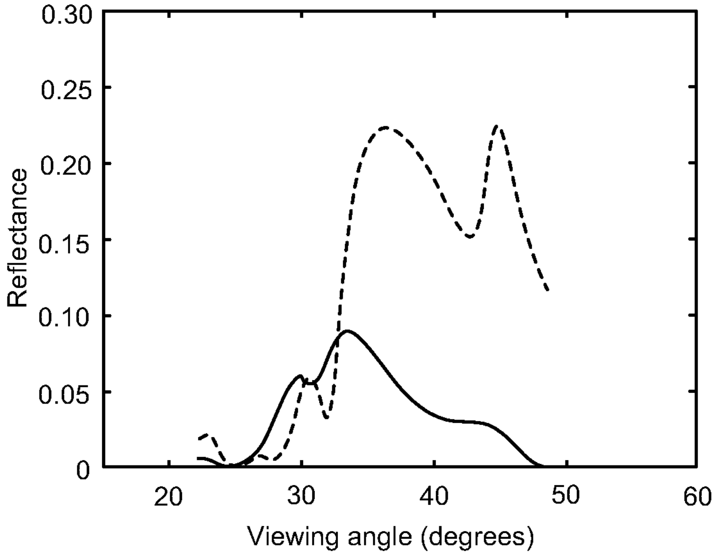
FIG. 12 is a graph depicting variation of reflectance as a function of viewing angle of a first reflected diffraction order from a layered structure having a diffraction layer with a periodicity longer than 600 nm.
Figure 13:
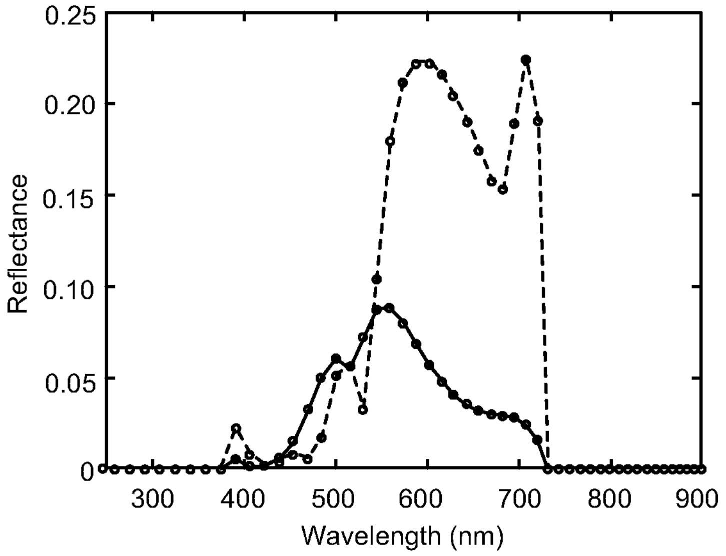
FIG. 13 is a graph depicting variation reflectance as a function of wavelength for the first reflected diffraction order in the configuration of FIG. 12.

The periodic structure will typically be configured to achieve visual effects via guided-mode resonance, which places an upper limit on a periodicity of the periodic structure. Typically, a period of the periodic structure will be less than 600 nm, preferably less than 550 nm, preferably less than 500 nm, preferably less than 450 nm, preferably less than 400 nm. In some embodiments, the periodic structure may have at least one periodicity with a longer wavelength, such as greater than 600 nm, in at least one direction. Such longer wavelength periodicities will lead to diffracted light outside of guided modes, leading to colours being reflected with a complex angular dependency that is difficult to replicate. Such configurations may be particularly desirable for security markings and/or decorative effects. Graphs exemplifying such angle-dependent reflectivity are shown in FIGS. 12 and 13. The curves are generated by computer simulation of a structure of the type depicted in FIG. 6 in the case where a reflector layer is provided below the substrate layer 13 and the periodicity is greater than 600 nm. FIG. 12 shows variation of reflectance as a function of viewing angle of a first reflected diffraction order, with the solid and broken line curves respectively representing the PCM layer 14 in the amorphous and crystalline states. FIG. 13 shows variation of reflectance as a function of wavelength for the first reflected diffraction order, again with the solid and broken line curves respectively representing the PCM layer 14 in the amorphous and crystalline states. The graphs of FIGS. 12 and 13 demonstrate strong angular dependence and lower overall contrast between the two states of the PCM layer 14 in comparison to embodiments where the periodic structure has a sub-wavelength pitch and more complete guided-mode resonance. At viewing angles of maximum contrast, the layered structure 10 is bright red when the PCM layer 14 is in the crystalline state and dark red when the PCM layer 14 is in the amorphous state.

The layered structure comprises a phase change material (PCM) layer 14. The PCM layer 14 may have various thicknesses, but may typically have a thickness in the range of 1 nm to 50 nm, preferably between 1 nm and 25 nm, preferably between 1 nm and 10 nm, for example around 5 nm. The PCM layer 14 comprises, consists essentially of, or consists of PCM that is thermally switchable between two stable states having different refractive indices. In some embodiments, the two stable states comprise a high extinction coefficient state and a low extinction coefficient state. The two states are stable in the sense that no energy is required to hold the PCM in the state after switching. The high extinction coefficient state may be substantially crystalline, and the low extinction coefficient state may be substantially amorphous. The switching is achieved thermally. Thermal energy for the switching may be provided in various ways. Typically, an electrically powered heater is used to provide the thermal energy. In the example of FIG. 5, a heating element 8 is positioned in thermal contact with the layered structure 10 of each display element 4. The heating element 8 may comprise a resistive heater. Each heating element 8 may be controllable independently of each other heating element 8. Each heating element 8 may thus be individually addressable. The individual addressability may be provided by any of various known techniques for driving individual pixels (display elements) in an array of pixels (display elements). Each heating element 8 may, for example, comprise an electronic unit (e.g. a thin film electronic selector element such as a thin-film transistor or diode, typically formed for example from doped amorphous silicon, polysilicon or crystalline silicon) which, when addressed by signals from row and column lines intersecting at the electronic unit, drives the heating element 8. The signals may be generated by external control electronics. Switching of the display elements 4 may be performed sequentially and/or simultaneously in a controlled manner to define a desired pattern to be written to the display device. The plurality of heating elements 8 may be considered as an example of a switching arrangement capable of applying heating to the display elements 4.

The PCM in the PCM layer 14 is positioned to allow optical coupling between the guided-mode resonance and the PCM. Thus, fields (evanescent and/or propagating) associated with the guided-mode resonance are influenced by the presence of the PCM. In some embodiments, the PCM is positioned such that the guided mode propagates at least partially through the PCM. Because of the high field intensity associated with the guided-mode resonance, the effect of the PCM can be extremely strong, particularly where the PCM is switched into a state of relatively high absorption. The effect of the PCM in such a high absorption state can be the same as a shutter, in the sense that the resonance can be effectively "switched off". The display element could thus be switched efficiently from a state having a vibrant colour to a state that is grey or black by switching the PCM in the layered structure 10 from one of the stable states (e.g. a low extinction coefficient state) to the other (e.g. a high extinction coefficient state).

It is desirable for the PCM layer 14 to be positioned without about 50 nm, optionally within about 25 nm, optionally within about 10 nm, of the region of the device where the light modes of the guided-mode resonance are concentrated, to allow sufficient coupling to the guided mode resonance. Typically, the PCM layer 14 is positioned within about 50 nm of the diffraction layer 11 to allow sufficient coupling to the guided-mode resonance, optionally within about 25 nm, optionally within about 10 nm.

Figure 9:
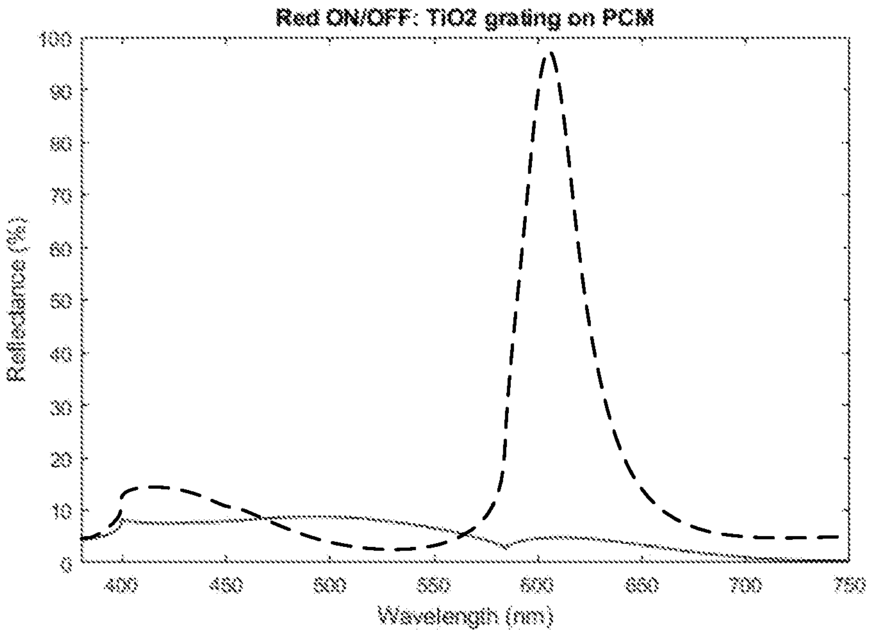
FIGS. 9-11 depict example reflectance spectra from the layered structure of FIG. 6 for different periodicities of the diffraction layer.
Figure 10:
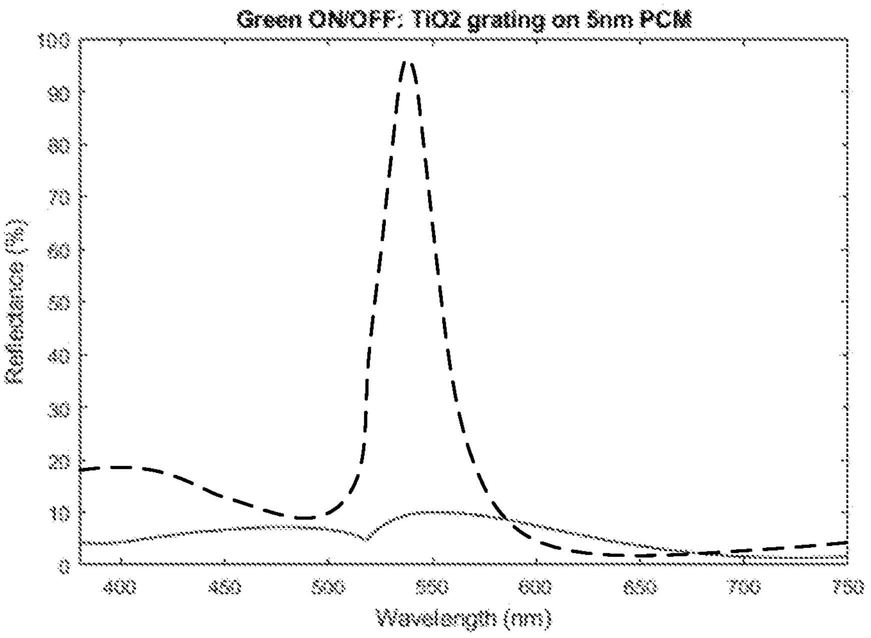
Figure 11:
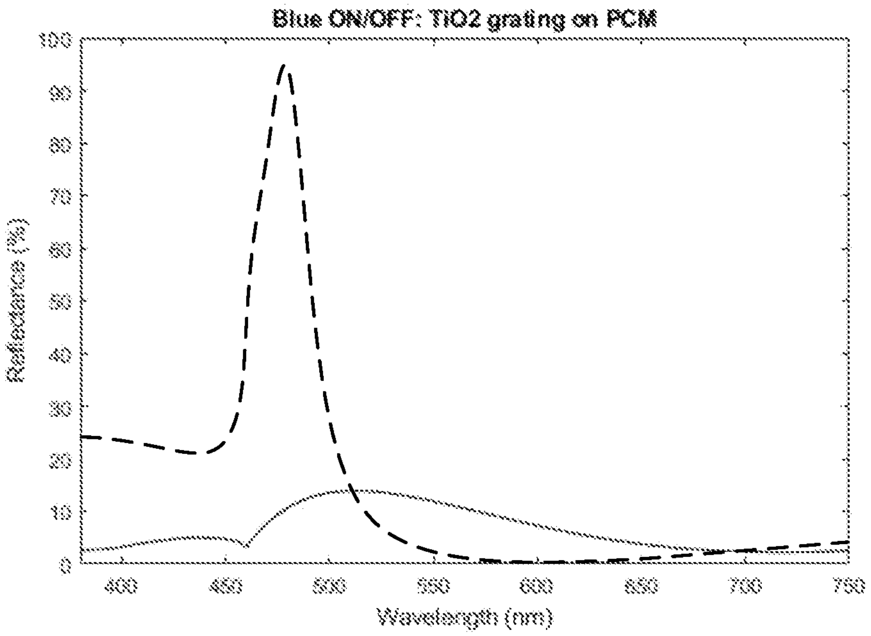

Three example spectra obtained by simulating illumination of a layered structure 10 of the type depicted in FIG. 6 with white light are shown in FIGS. 9-11 for different periodicities of the periodic structure in the diffraction layer 11. The PCM layer 14 was modelled as consisting of a material having the same complex refractive index (n, k) as germanium telluride (Ge50:Te50), with the k of the amorphous state artificially reduced to 0.01 of its original value. FIG. 9 shows spectra depicting effective switching between a coloured "ON" state (broken line curve) and a grey "OFF" state (solid line curve). The ON state strongly reflects red and is achieved by switching the PCM into a low extinction coefficient state. The OFF state disrupts the guided-mode resonance and is achieved by switching the PCM into a high extinction coefficient state. FIGS. 10 and 11 show corresponding simulations for configurations tuned (by varying a periodicity of the periodic structure in the diffraction layer 11) to respectively reflect green and blue in the ON states.

In some embodiments, the PCM layer 14 is positioned directly adjacent to the diffraction layer 11. In other embodiments, as exemplified in FIGS. 6-8, the PCM layer 14 is positioned with a first support layer 12 between the periodic structure and the PCM layer 14. In some embodiments, the first support layer 12 is configured to act as a waveguiding layer for guiding the guided-mode resonance. Various other configurations are possible, including for example having the PCM layer 14 above the diffraction layer 11, e.g. with the first support layer 12 on an opposite side of the diffraction layer 11 to the PCM layer 14. Alternatively or additionally, one or more further PCM layers may be provided, each further PCM layer being switchable between two stable states having different refractive indices. In some embodiments, the PCM layer 14 and at least one of the further PCM layers are provided on opposite sides of the diffraction layer 11. This arrangement may facilitate positioning of PCM close to where guided-mode resonance occurs, thereby promoting efficient interaction between the PCM and the guided-mode resonance. The provision of one or more further PCM layers also provides flexibility for providing a wider range of visual effects.

The layered structure 10 of each display element 4 may comprise layers additional to the diffraction layer 11, first support layer 12, PCM layer 14 and substrate layer 13. The additional layers may also influence optical effects achieved by the layered structure 10, e.g. by contributing to interference effects or by providing additional reflectivity. In some embodiments, the layered structure 10 further comprises a second support layer between the first support layer and the PCM layer 14. The second support layer may thus be used to space the PCM layer 14 further away from the diffraction layer 11. Spacing the PCM layer 14 further away from the diffraction layer 11 may control (deliberately weaken) an influence of the PCM on the guided-mode resonance. Alternatively or additionally, the second support layer may act as a spacer layer to provide desirable interference effects.

In some embodiments, the layered structure 10 further comprises a reflector layer. The PCM layer 14 may be positioned on a side of the diffraction layer 11 opposite to the reflector layer 11 or between the diffraction layer 11 and the reflector layer 11. The reflector layer 11 may be a passive layer. The reflector layer may for example comprise a metallic layer of sufficient thickness to substantially fully reflect visible light for example.

Each of one or more of the layers in the layered structure 10 of each display element 4 may optionally span across multiple display elements 4 to facilitate fabrication. Thus, one or more of the layers may be shared by different display elements 4. In the example of FIG. 5, all of the layers in the layered structures 10 of the display elements 4 shown are shared between all of the display elements 4 shown. In other embodiments, each display element 4 may be provided with a layered structure 10 that is discontinuous with the layered structure of each other display element 4 (e.g. each display element 4 may comprise a stack of layers that is separated from the stack of layers of each other display element 4 by a filler material).

In an embodiment, the PCM extinction coefficient is at least three times higher (optionally at least four times higher, optionally at least five times higher, optionally at least 10 times higher), for most or all wavelengths in the visible range of light, in the high extinction coefficient state than in the low extinction coefficient state. In an embodiment, a ratio of a mean average over the visible spectrum of the extinction coefficient of the PCM layer 14 in the high extinction coefficient state to a mean average over the visible spectrum of the extinction coefficient of the PCM layer 14 in the low extinction coefficient state is greater than 3.0 (optionally greater than 4.0, optionally greater than 5.0, optionally greater than 7.5, optionally greater than 10.0). The extinction coefficient is herein understood to refer to the imaginary part of the refractive index. In addition to having the large difference between the extinction coefficients in the two stable states, in some embodiments the composition of the PCM layer 14 is selected so that the extinction coefficient in the high extinction coefficient state is limited to be no more than 1.0 on average. For example, a mean average over the visible spectrum of the extinction coefficient in the high extinction state is less than 1.0. The inventors have found that this combination of properties for the PCM layer 14 allow high black/white contrast to be achieved without sacrificing white state reflectivity or colour gamut, and without requiring that the PCM layer 14 is undesirably thin.

Each of one or more of the PCM layers 14 may comprise, consist essentially of, or consist of, one or more of the following in any combination: $Sb_2S_3$; $Ge_2Sb_2Se_4Te$; GeSbTeO; GeSnTeO; GeSnSbTeO; TeBiSnN; TeBiSnS; TeBiSnO; SeSnBi; SeSnBiO; SeSnGcO.

In some embodiments, each of one or more of the PCM layers 14 may comprise, consist essentially of, or consist of $AgSbSe_2$. $AgSbTe_2$ is one of the most superior PCM alloys for high speed PC optical disks, showing very fast crystallization speed, good cyclability, and low melting temperature (552 C). The large optical absorption of the composition at blue-violet wavelength would not be optimal for use as the PCM layer 14. On the other hand, $AgSbSe_2$, a p-type semiconductor, shows higher transmittance and lower crystallization speed with decent cyclability (although the melting temperature of 610 C is a bit higher than $AgSbTe_2$), and is therefore suitable for use as the PCM layer 14. Related compositions, which may have lower melting points, may also be used, such as $(Ag_2Se)_{1-x}(Sb_2Se_3)_x$ wherein, preferably, 0.5≤x or 0.5≤x<0.7.

Furthermore, $AgSbSe_2$ and $AgSbTe_2$ have similar rock salt type crystal structures and can be easily mixed. The mixture between two alloys provides further options for the PCM layer 14. For example, $AgSbTe_{2-y}Se_y$ may be used, wherein, preferably, 2≥y≥0.5. Additionally, it is known that $AgBiTe_2$ and $AgBiSe_2$ also have similar rock salt structures to that of $AgSbSe_2$. Thus, $Ag(Sb_{1-z}Bi_z)Te_{2-y}Se_y$ may also be used, wherein, preferably, 2≥y≥0.5 and/or 1≥z≥0.

In view of the above, each of one or more of the PCM layers 14 may therefore comprise, consist essentially of, or consist of, one or more of the following in any combination:

$(Ag_2Se)_{1-x}(Sb_2Se_3)_x$ wherein, preferably, 0.5≤x;
$(Ag_2Se)_{1-x}(Sb_2Se_3)_x$ wherein, preferably, 0.5≤x<0.7;
$AgSbSe_2$;
$AgSbTe_{2-y}Se_y$ wherein, preferably, 2≥y≥0.5; and
$Ag(Sb_{1-z}Bi_z)Te_{2-y}Se_y$ wherein, preferably, 2≥y≥0.5 and/or 1≥z≥0.

Other materials that can be used for the PCM layers 6 including the following, in any combination:

$(Te_{80}Sn_{15}Ge_5)_{1-x}S_x$ wherein, preferably, 0≤x≤0.2;
$(Te_{80}Sn_{15}Ge_5)_{1-x}Se_x$ wherein, preferably, 0≤x≤0.4;
$(Te_{80}Sn_{15}Bi_5)_{1-x}S_x$ wherein, preferably, 0≤x≤0.2; and
$(Te_{80}Sn_{15}Bi_5)_{1-x}Se_x$ wherein, preferably, 0≤x≤0.4.

In some embodiments, the switching arrangement (e.g. comprising heating elements 8) is configured to apply heating to each display element 4 according to each of a plurality of different heating profiles. Thus, the switching arrangement is capable of selectively applying each and every one of the heating profiles. Each heating profile may define a variation of power as a function of time provided by a heating element 8 of the display element 4. A first profile may be provided for switching the PCM from a first stable state to a second stable state, and a second profile may be provided for switching the phase change material from the second stable state to the first stable state. Different heating profiles may last for different periods of time and/or involve different average powers and/or different shapes of power versus time (square wave pulse, ramping up, ramping down, oscillatory, etc.). Applying different heating profiles allows selective switching between different phases, such as to selectively switch the PCM from amorphous to crystalline or from crystalline to amorphous. For example, a control signal comprising a current pulse of relatively low amplitude and long duration may be effective for switching the PCM from an amorphous state to a crystalline state, the resulting heating profile being such that the PCM is heated to a temperature higher than the crystallization temperature $T_C$ of the PCM, but less than the melting temperature $T_M$ of the PCM. The temperature is maintained above the crystallization temperature $T_C$ for a time sufficient to crystallize the PCM. A control signal comprising a current pulse of higher amplitude but shorter duration may be effective for switching the PCM from a crystalline state to an amorphous state, the resulting heating profile being such that the PCM is heated to a temperature that is higher than the melting temperature $T_M$, causing melting of the PCM, but is cooled sufficiently quickly that re-crystallization does not occur excessively and the PCM freezes into an amorphous state. After the heating of the PCM has finished the PCM remains in the stable state selected (e.g., amorphous or crystalline) until further heating is applied. Thus, when based on PCM the pixel region is naturally held in a given optical state without application of any signal, and can thus operate with significantly less power than other display technologies. Switching can be performed an effectively limitless number of times. The switching speed is also very rapid, typically less than 300 ns, and certainly several orders faster than the human eye can perceive.

In embodiments where the layered structure 10 comprises one or more further PCM layers (i.e. such that there is one PCM layer 14 and one or more further PCM layers). Each further PCM layer may be switchable between at least a high extinction coefficient state and a low extinction coefficient state. For each further PCM layer, a ratio of a mean average over the visible spectrum of the extinction coefficient of the further PCM layer in the high extinction coefficient state to a mean average over the visible spectrum of the extinction coefficient of the further PCM layer in the low extinction coefficient state is greater than 3.0 (optionally greater than 4.0, optionally greater than 5.0, optionally greater than 7.5, optionally greater than 10.0).

In an embodiment, within each display element 4, each PCM layer is in thermal contact with each other PCM layer (of the same display element 4). The thermal contact is such that the heating provided by the switching arrangement causes a substantially identical variation of temperature during the heating in each of the PCM layers in the display element 4. The different PCM layers are configured, however, so that each heating profile can have a different effect on different PCM layers (e.g. to switch or not to switch each PCM layer). For example, in some embodiments, the plurality of heating profiles comprises a heating profile that causes switching of a first of the PCM layers without switching of at least a second of the PCM layers in the display element 4. In some embodiments, the plurality of heating profiles comprises a heating profile that causes switching of the second PCM layer without switching of the first PCM layer. Similarly, the plurality of heating profiles may be configured so that there is a heating profile that can simultaneously cause switching of two or more of the PCM layers from the high extinction coefficient state to the low extinction coefficient state and a heating profile that simultaneously causes switching of two or more of the PCM layers from the low extinction coefficient state to the high extinction coefficient state. The ability to selectively switch different combinations of the PCM layers may be achieved for example by arranging for the different PCM layers to have suitably different transition temperatures (e.g. different melting points, crystallization temperatures, etc.). A wide range of combinations of switched states for the PCM layers can thereby be achieved without any corresponding increase in the complexity of the switching arrangement. The switching arrangement may, for example, still comprise a single heating element 8 per display element 4 and the different switching functionalities be achieved simply by varying the heating profile provided by the heating element 8 (e.g. by varying an average power and/or duration of the heating).

Figure 14:
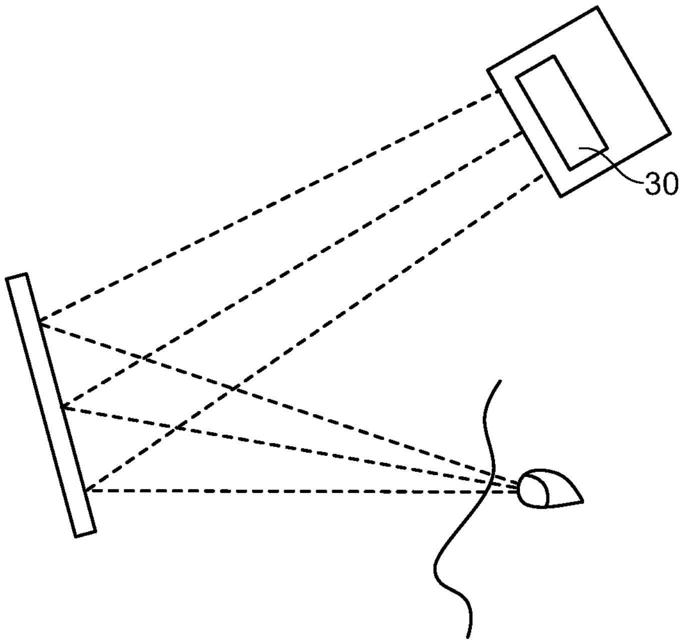
FIGS. 14-15 schematically depict examples of projection devices using display elements according to embodiments of the disclosure.
Figure 15:
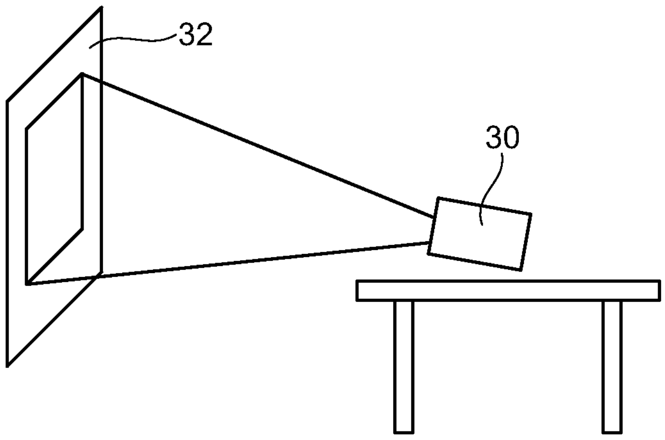

The embodiments described above comprise display elements having both a diffraction layer 11 and a PCM layer 14. Providing a plurality of such display elements allows patterns to be formed by switching of the PCM layers 14. This can be done actively, for example using a switching arrangement, to provide an active display. Due to the strong angular dependence, such displays may be used most easily in situations where viewing of the image is done within a small range of viewing angles. As exemplified in FIGS. 14 and 15, the display device may be used within a projection device 30. In such cases, the display device 2 comprises a plurality of display elements. The projection device 30 projects an image defined by respective switched states of the phase change material layers in the display elements. FIG. 14 depicts an example where the projection device 30 is a heads-up display (HUD). FIG. 15 depicts an example where the projection device 30 is configured to project an image onto a projection screen 32, such as in a cinema or for a presentation or lecture.

The invention claimed is:

1. A display device for displaying a pattern, comprising:

at least one display element having a layered structure, the layered structure comprising:

a diffraction layer comprising a periodic structure configured to diffract incident visible light into a guided-mode resonance in the layered structure;

a first phase change material layer and a second phase change material layer, each of the first phase change material layer and the second phase change material layer comprising a phase change material that is thermally switchable between two stable states having different refractive indices, the phase change material being positioned to allow coupling between the guided-mode resonance and the phase change material;

wherein the diffraction layer is interposed between the first phase change material layer and the second phase change material layer such that the first phase change material layer and the second phase change material layer are positioned on opposite sides of the diffraction layer.

2. The device of claim 1, wherein the phase change material is positioned such that a guided mode propagates at least partially through the phase change material.

3. The device of claim 1, wherein the periodic structure has a period of less than 600 nm in at least one direction.

4. The device of claim 1, wherein the layered structure comprises a first support layer positioned between the periodic structure and the first phase change material layer.

5. The device of claim 4, wherein the first support layer is configured to act as a waveguiding layer for guiding the guided-mode resonance.

6. The device of claim 4, wherein the first support layer has the same composition as a portion of the periodic structure and is integrally formed with the portion of the periodic structure.

7. The device of 4, wherein the layered structure further comprises a second support layer having a different composition to the first support layer, the second support layer being between the first support layer and the first phase change material layer.

8. The device of claim 1, wherein the layered structure further comprises a reflector layer.

9. The device of claim 1, wherein the periodic structure has a period greater than 600 nm in at least one direction.

10. The device of claim 1, wherein the periodic structure is periodic in one direction only.

11. The device of claim 1, wherein the periodic structure is periodic in two directions.

12. The device of claim 11, wherein the periodic structure defines crossed diffraction gratings.

13. The device of claim 11, wherein the periodic structure has a pattern with a first periodicity in at least one direction and a second periodicity in at least one direction, the first periodicity being different to the second periodicity.

14. The device of claim 1, wherein the periodic structure comprises a blazed grating or a metastructure.

15. The device of claim 1, wherein the two stable states of the phase change material comprise a high extinction coefficient state and a low extinction coefficient state.

16. The device of claim 15, wherein a ratio of a mean average over the visible spectrum of the extinction coefficient of at least one of the phase change material layers in the high extinction coefficient state to a mean average over the visible spectrum of the extinction coefficient of the respective phase change material layer in the low extinction coefficient state is greater than 3.0.

17. The device of claim 16, wherein a mean average over the visible spectrum of the extinction coefficient in the high extinction coefficient state is less than 1.0.

18. The device of claim 1, wherein the phase change material comprises one or more of the following:

$(Ag_2Se)_{1-x}(Sb_2Se_3)_x$ wherein, 0.5≤x;

$(Ag_2Se)_{1-x}(Sb_2Se_3)_x$ wherein, 0.5≤x<0.7;

$AgSbSe_2$;

$AgSbTe_{2-y}Se_y$ wherein, 2≥y≥0.5;

$Ag(Sb_{1-z}Bi_z)Te_{2-y}Se_y$ wherein, 2≥y≥0.5 and 1≥z≥0;

$(Te_{80}Sn_{15}Ge_5)_{1-x}S_x$ wherein, 0≤x≤0.2;

$(Te_{80}Sn_{15}Ge_5)_{1-x}Se_x$ wherein, 0≤x≤0.4;

$(Te_{80}Sn_{15}Bi_5)_{1-x}S_x$ wherein, 0≤x≤0.2; and $(Te_{80}Sn_{15}Bi_5)_{1-x}Se_x$ wherein, 0≤x≤0.4.

19. The device of claim 1, wherein the phase change material is selected from the group consisting of: $Sb_2S_3$; $Ge_2Sb_2Se_4Te$; GeSbTeO; GeSnTeO; GeSnSbTeO; TeBiSnN; TeBiSnS; TeBiSnO; SeSnBi; SeSnBiO; and SeSnGeO.

20. The device of claim 1, further comprising a heating element configured to heat the display element according to a plurality of different heating profiles.

21. The device of claim 20, wherein:

the two stable states comprise a first stable state and a second stable state, and the plurality of heating profiles comprise a first profile for switching the phase change material of at least one of the first phase change material layer and the second phase change material layer from the first stable state to the second stable state, and a second profile for switching the phase change material of the at least one of the first phase change material layer and the second phase change material layer from the second stable state to the first stable state.

22. The device of claim 20, comprising a plurality of the display elements and wherein the switching arrangement is configured to allow the display elements to be heated substantially independently of each other.

23. A projection device comprising the display device of claim 1, wherein:

the display device comprising a plurality of the display elements; and the projection device is configured to project an image defined by respective switched states of the phase change material layers in the display elements.

* * * * *